(12) United States Patent
Splitthoff et al.

(10) Patent No.: US 11,353,534 B2
(45) Date of Patent: Jun. 7, 2022

(54) METHOD FOR ACQUIRING A MAGNETIC RESONANCE DATA SET, DATA STORAGE MEDIUM, COMPUTER PROGRAM PRODUCT, AND MAGNETIC RESONANCE SYSTEM

(71) Applicant: Siemens Healthcare GmbH, Erlangen (DE)

(72) Inventors: Daniel Nicolas Splitthoff, Uttenreuth (DE); Tobias Kober, Lausanne (CH); Randall Kroeker, Erlangen (DE); Daniel Przioda, Erlangen (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/950,895

(22) Filed: Nov. 17, 2020

(65) Prior Publication Data
US 2021/0149006 A1    May 20, 2021

(30) Foreign Application Priority Data
Nov. 20, 2019   (DE) ..................... 10 2019 217 884.7

(51) Int. Cl.
*G01V 3/00*      (2006.01)
*G01R 33/565*    (2006.01)
(Continued)

(52) U.S. Cl.
CPC ... *G01R 33/56509* (2013.01); *G01R 33/5608* (2013.01); *G01R 33/5611* (2013.01); *G01R 33/5616* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

2011/0085084 A1* 4/2011 Jain ........................ H04N 19/86
                                                              348/598
2012/0268124 A1   10/2012 Herbst
(Continued)

FOREIGN PATENT DOCUMENTS

DE     102011007574 A1   10/2012
EP         2921100 A1    9/2015

OTHER PUBLICATIONS

German Office Action for German Application No. 10 2019 217 884.7 dated Oct. 20, 2020.
(Continued)

*Primary Examiner* — Walter L Lindsay Jr.
*Assistant Examiner* — Frederick Wenderoth
(74) *Attorney, Agent, or Firm* — Lempia Summerfield Katz LLC

(57) ABSTRACT

A method for acquiring a magnetic resonance data set of an object under examination by a magnetic resonance system using a scan sequence is provided. The scan sequence includes a succession of sequence blocks, and in each sequence block, there is at least one sub-block including an excitation section and/or a detection section. An excitation section includes at least one excitation pulse, and in a detection section, an echo signal or an echo train is acquired as a scan signal. At least one item of motion information is provided for each sub-block. The motion information contains information about a movement of the object under examination within a duration of the sub-block. Some of the sub-blocks are automatically repeated. At least the sub-blocks having motion information that exceeds a threshold value are repeated. The threshold value defines a motion amplitude.

14 Claims, 10 Drawing Sheets

(51) Int. Cl.
 G01R 33/561 (2006.01)
 G01R 33/56 (2006.01)
(58) Field of Classification Search
 USPC .......................................... 324/309
 See application file for complete search history.

(56) References Cited

U.S. PATENT DOCUMENTS

| 2015/0265219 | A1 | 9/2015 | Feiweier | |
|---|---|---|---|---|
| 2015/0330832 | A1* | 11/2015 | Varghese | A61B 18/1482 |
| | | | | 702/191 |
| 2017/0110887 | A1* | 4/2017 | Bell | H04B 5/0037 |
| 2017/0296072 | A1* | 10/2017 | Priatna | A61B 5/0263 |
| 2018/0210050 | A1* | 7/2018 | Rosen | G01R 33/5605 |

OTHER PUBLICATIONS

Zaitsev, Maxim, et al. "Magnetic resonance imaging of freely moving objects: prospective real-time motion correction using an external optical motion tracking system." Neuroimage 31.3 (2006): 1038-1050.

* cited by examiner

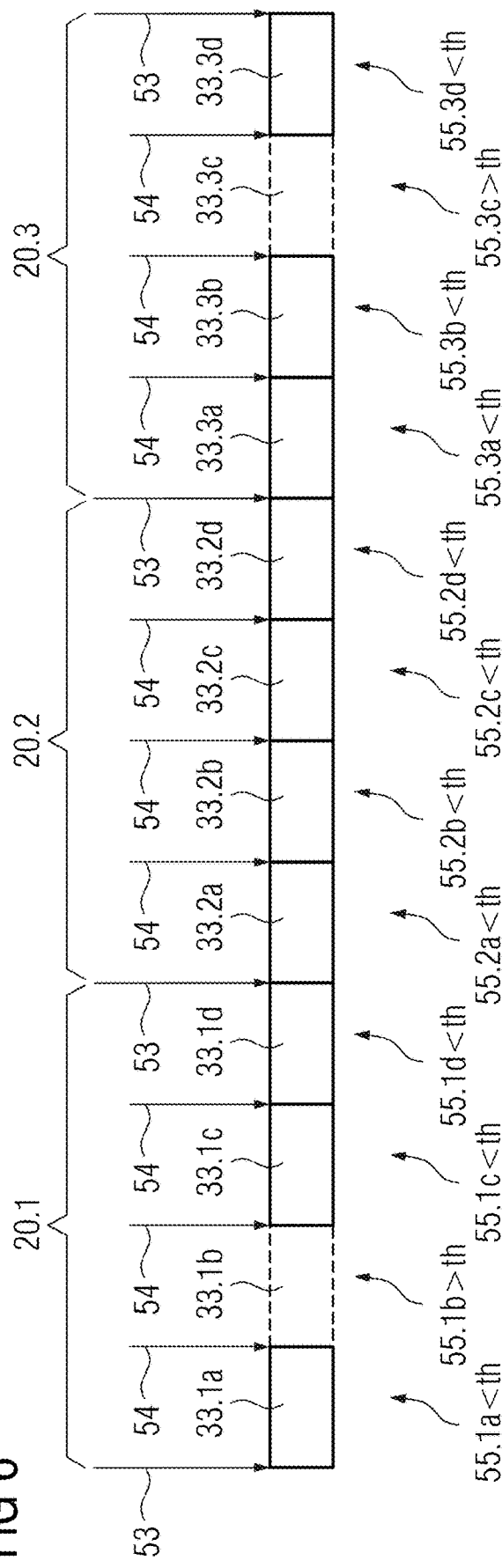
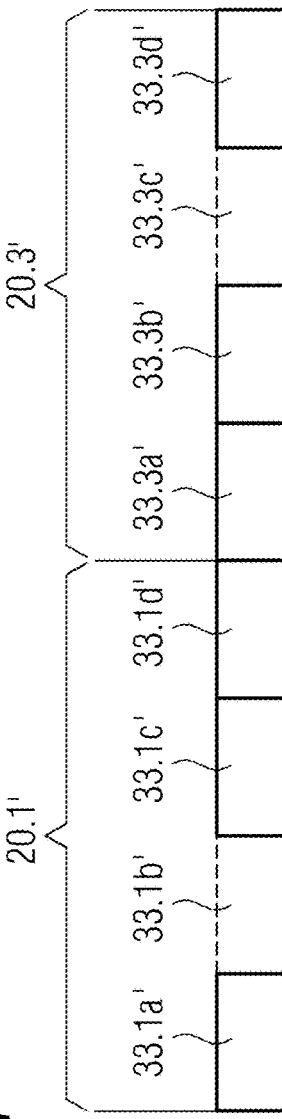
FIG 6
FIG 7

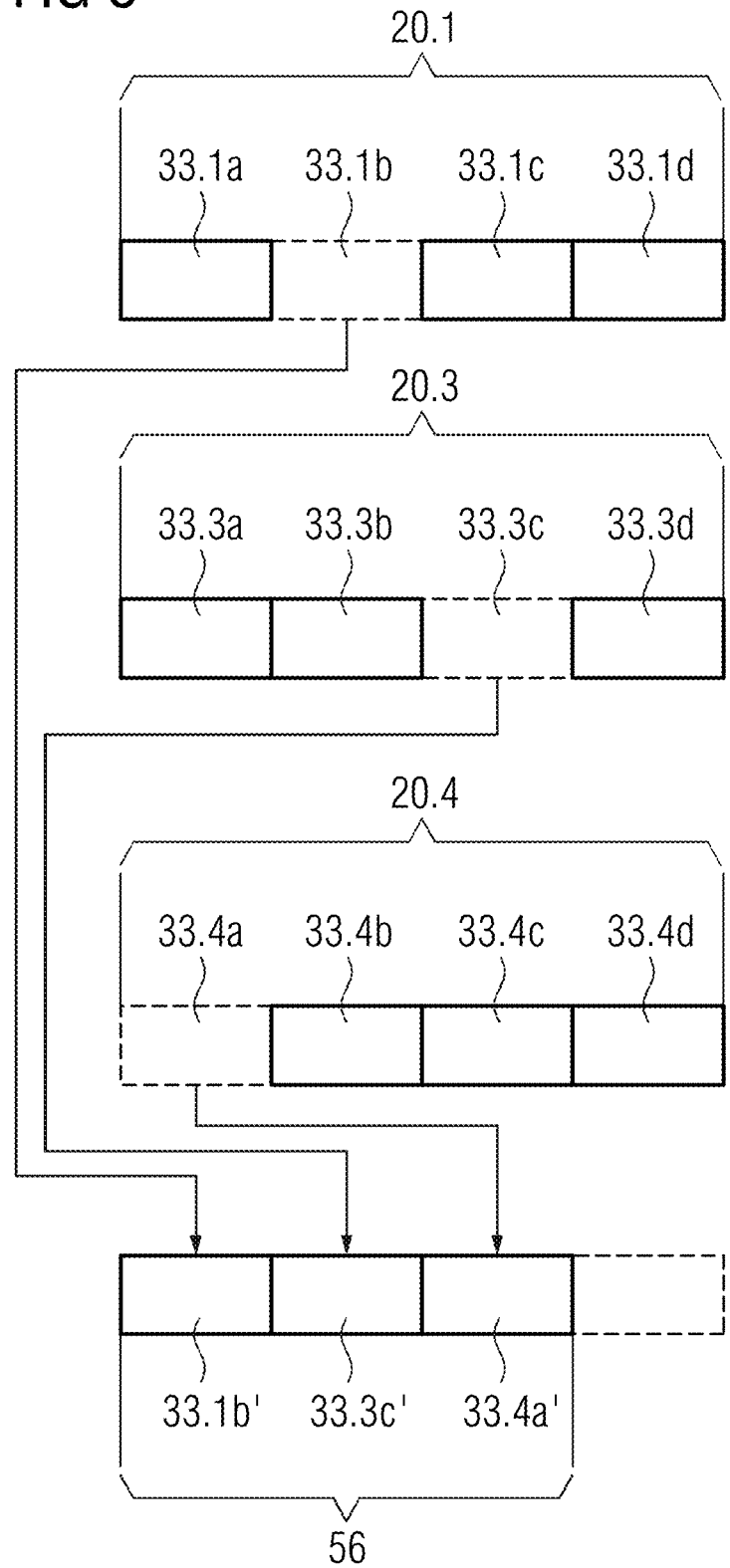

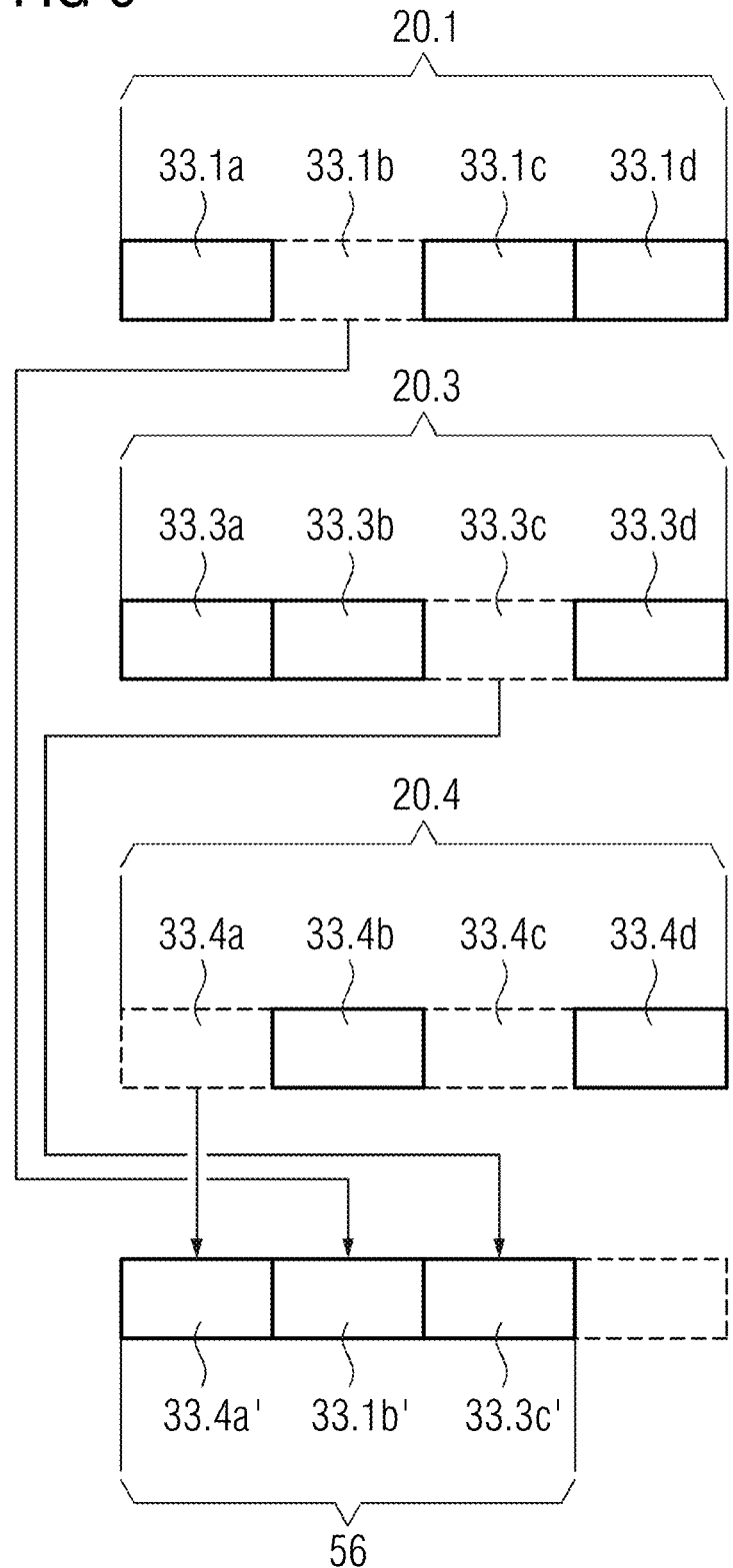

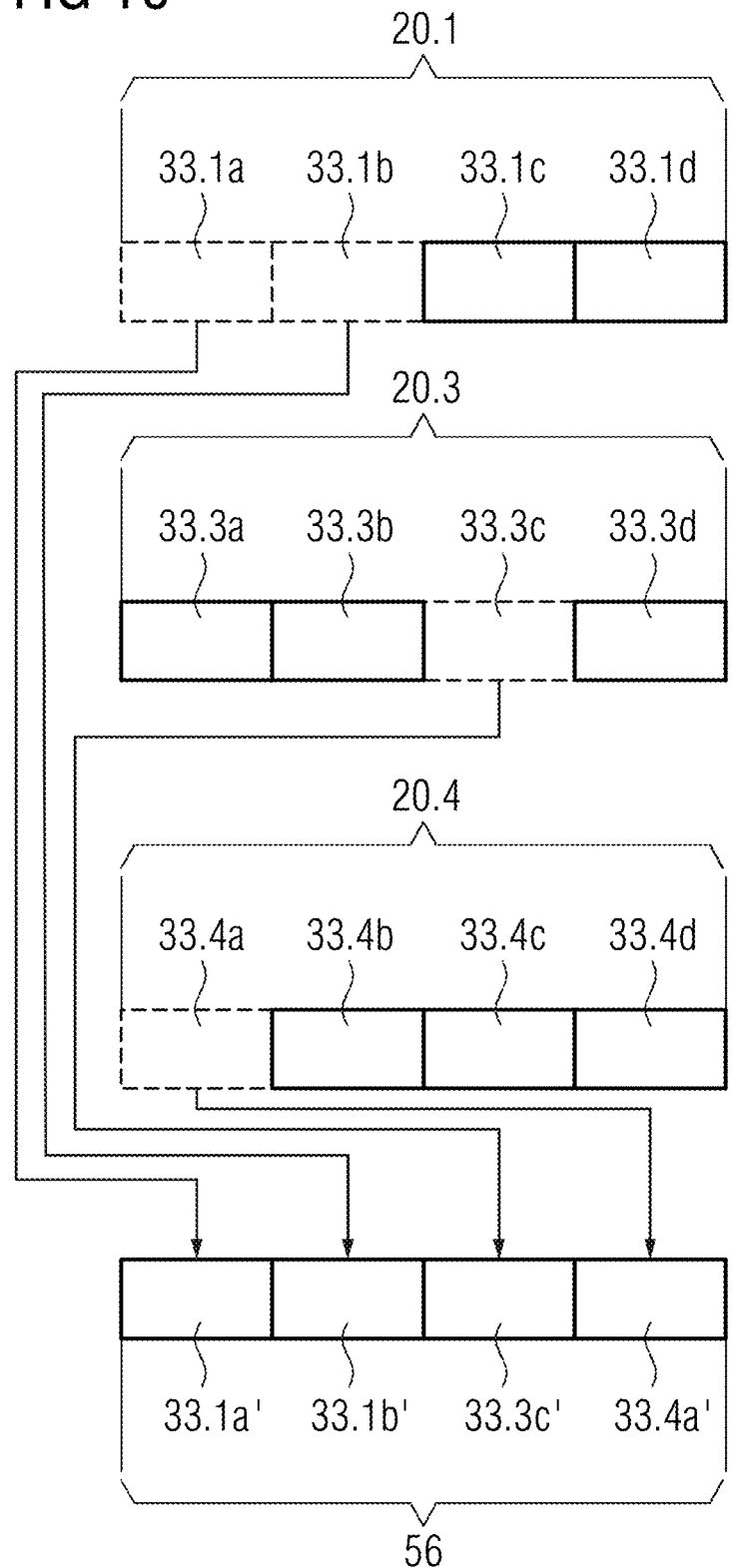

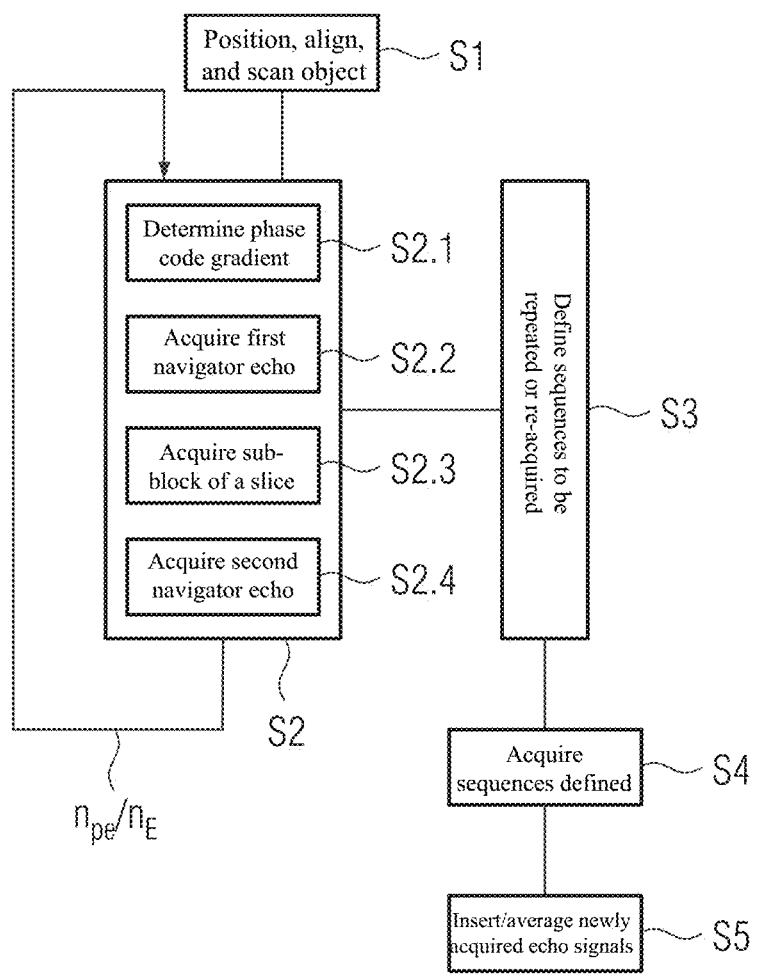

METHOD FOR ACQUIRING A MAGNETIC RESONANCE DATA SET, DATA STORAGE MEDIUM, COMPUTER PROGRAM PRODUCT, AND MAGNETIC RESONANCE SYSTEM

This application claims the benefit of German Patent Application No. DE 10 2019 217 884.7, filed Nov. 20, 2019, which is hereby incorporated by reference in its entirety.

BACKGROUND

The present embodiments relate to acquiring a magnetic resonance data set of an object under examination by a magnetic resonance system using a scan sequence.

In magnetic resonance tomography, slice images of objects under examination are acquired. In order to obtain an image data set, the signal is to be position encoded. Magnetic field gradients are used for this purpose, where position encoding in one direction may take place as frequency encoding. However, in the second and, in case of a 3D data set, third direction, phase encoding is to be used.

The term scan sequence denotes a predefined sequence of radio frequency (RF) pulses, magnetic field gradients, acquisition windows, and wait times. Examples of such scan sequences are a gradient echo (GE) scan sequence, a spin echo (SE) scan sequence, fast low angle shot (FLASH), a turbo spin echo (TSE) scan sequence, a magnetization prepared rapid gradient echo (MP-RAGE) scan sequence, and many more besides.

As described above, a scan sequence consists of a succession of sequence blocks. In each sequence block, the order of the RF pulses, magnetic field gradients, and wait times is basically the same, and only the strength of the phase encode gradient varies. The object under examination is not to move during the course of a scan sequence, as otherwise, the position encoding across the sequence blocks will be displaced with respect to the object under examination, resulting in motion artifacts.

Movements may basically be differentiated into periodic and aperiodic motion. Periodic motion such as heartbeat and respiratory movements may be detected by sensors. The sequence blocks may then be triggered at specific times in the periodic motion. As a result, the individual signals are always acquired at the same time within the motion.

Another type of motion is aperiodic motion. This may be the movement of a limb, the head, or the trunk. Aperiodic motion is not predictable. However, methods have been developed to reduce artifacts caused by aperiodic motion.

Magnetic resonance systems now have methods for motion correction (e.g., navigator acquisitions, field sampling, or even optical systems that use cameras or similar for motion detection). In these methods, patient motion is tracked, and the coordinate system is adapted to the scan sequence accordingly in real time. Because the coordinate system is moved "with the patient", this real-time correction can prevent many motion artifacts.

However, there are a number of limitations here: fast movements usually cannot be completely detected and corrected. The reason for this is the latency between the moment of the motion and the scan system (e.g., the time required for motion detection and forwarding of the corresponding correction commands) and the correction itself.

The field of view of, for example, the optical motion correction camera is reduced due to the coil elements mounted on the top of the head coil and the tiltability of the head coil, thereby limiting the usefulness of the camera. As a result, for example, only a certain angular range of head rotation may be corrected.

Consequently, using the correction data for motion correction is not always optimal or not always completely possible. This applies even more to navigator-based correction methods, because there the scan frequency (e.g., the amount of position data determined for the acquired object) is typically much lower, and if the above mentioned latency is higher.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method for acquiring a magnetic resonance data set of an object under examination using a magnetic resonance system is provided. The method provides improved image quality in image data sets obtained from the magnetic resonance data set.

A method for acquiring a magnetic resonance data set of an object under examination by a magnetic resonance system using a scan sequence is provided. The scan sequence includes a succession of sequence blocks, and in each sequence block, there is at least one sub-block including an excitation section and a detection section. An excitation section includes at least one excitation pulse, and in a detection section, an echo signal or an echo train is acquired as a scan signal. At least one item of motion information is provided for each sub-block. The motion information contains information about a movement of the object under examination within the duration of the sub-block. Some of the sub-blocks are repeatedly acquired automatically. At least the sub-blocks having motion information that indicates a movement that allows (e.g., results in) a motion artifact in an image data set reconstructed from the magnetic resonance data set are repeated. For example, at least the sub-blocks having motion information that indicates a movement that would produce a motion artifact in the image data set reconstructed from the magnetic resonance data set if the sub-blocks were not repeated are repeated.

A magnetic resonance data set is a collection of scan signal values. The magnetic resonance data set may be a magnetic resonance image data set that will then contain position encoded scan signals. A magnetic resonance data set is acquired using a scan sequence.

A scan sequence is a particular sequence of RF pulses, magnetic field gradients, acquisition windows, and wait times. Examples of a scan sequence are, as described above, a GE scan sequence, an SE scan sequence, FLASH, and TSE.

Each scan sequence consists of a succession of sequence blocks. An SE scan sequence includes, in a single sequence block (e.g., a single sequence), a 90° excitation pulse with a simultaneously applied slice select gradient, immediately followed by a slice rephase gradient, a 180° refocusing pulse, a phase encode gradient, a read dephase gradient, and an acquisition window with a read gradient applied. After closing of the acquisition window, a wait time of several hundred milliseconds to a few seconds is allowed to elapse in order to obtain the desired repetition time TR. The repetition time TR is the duration of a sequence block. The positioning of the phase encode gradient and the read dephase gradient is possible before or after the 180° refocusing pulse.

The 90° excitation pulse constitutes the excitation section or excitation phase. This is followed by the detection section.

In the detection section, the acquisition window is opened. The excitation section and the detection section are mandatory for a sequence block, as otherwise, either no signal is generated, or the generated signal is not acquired.

This single sequence block is repeated $n_{pe}$ times with changing phase encode gradient, where $n_{pe}$ is the number of phase encoding steps. The number $n_{pe}$ of phase encoding steps depends on the resolution to be achieved and whether parallel imaging is used.

There may be further repetitions with then repeating phase encode gradients. These are then often referred to as averagings and are used to increase the signal-to-noise ratio (SNR). All the sequence blocks are completely repeated.

A sub-block contains at least one detection section or one excitation section. In one embodiment, the sub-block has one detection section and one excitation section.

In the case of a spin echo scan sequence, there is therefore just one excitation section and just one detection section in a sequence block. In the detection section, just one echo signal is acquired. A sequence block of a spin echo scan sequence therefore has only one sub-block including an excitation section and a detection section.

A sub-block may constitute a physically meaningful coherent part of the scan sequence. A sub-block is often characterized in that no useful real-time motion correction may be performed during the sub-block. In practice, it may be disadvantageous, for example, to change the field of view in real time during a typical 100-200 ms long echo train of a TSE sequence because secondary effects disturb the magnetization to such an extent that the advantage of correction of the motion occurring cannot be outweighed thereby. Accordingly, a gradient readout train may be a sub-block in an EPI sequence and/or a single k-space line in an MR-RAGE sequence, for example.

At least one item of motion information is provided for each detection section, in a spin echo scan sequence for each echo signal. The motion information is information about a movement of the object under examination within the duration of the sub-block. Within the duration may be at some time during the sub-block. The motion does not have to last the whole sub-block nor does the motion have to occur at a particular point in time. The motion during a sub-block may also be in a plurality of parts. The important factor with regard to motion artifacts is, for example, that there has been too much uncorrected motion. The motion information contains, for example, information about a change of position, which is motion.

There are basically three categories of motion information for which repetition is performed because otherwise motion artifacts are possible in the reconstructed image data set.

First, there may be no motion information at all for a sub-block (e.g., because the sensor providing the motion information has temporarily failed or detection of the movement was unsuccessful). The sensor may generally be a device or method for acquiring and identifying motion information, as will be presented below. In this case, motion information that indicates a movement that allows a motion artifact in an image data set reconstructed from the magnetic resonance data set is equivalent to motion information that indicates deficient (e.g., missing) motion detection.

Second, although a movement may have been detected, the motion information is deficient in terms of quality. For example, markers may be placed on a nose of a patient to detect movement. If these are at an unfavorable angle to a camera, only some of the head movements will be acquired. The motion information will then be deficient. In this case, motion information that indicates a movement that allows a motion artifact in an image data set reconstructed from the magnetic resonance data set is equivalent to motion information that indicates deficient motion detection.

Alternatively or in addition, further metrics may be used to assess the possible quality of motion correction. These include the latencies caused by the tracking software and the structure of the scan sequence, and also information as to whether it was possible to derive reliable motion parameters at the given time. In these cases, the quality of the motion information may even be excellent, but any resulting motion correction may still be deficient. Here too, the motion information indicates a motion that allows a motion artifact in an image data set reconstructed from the magnetic resonance data set.

Third, motion in the sense of a motion amplitude may be correctly detected, but motion correction, especially as described below, may be only partially successful or failed. This is always the case if the motion is present during a detection section. Alternatively, uncorrectable motion may have been detected. In this case, motion information that indicates a motion that allows a motion artifact in an image data set reconstructed from the magnetic resonance data set is equivalent to motion information that exceeds a threshold value, where the threshold value defines a motion amplitude.

Automatic repetition of a sub-block or sequence block may basically be performed in each of the three cases. However, as it is only in the last case that it is really certain that a motion artifact will occur, only the last case may be taken into account.

In the following, the focus will therefore be more on the exceeding of a threshold value of a motion amplitude, without excluding the first two categories.

The motion information may either be calculated directly from scan data or be estimated values or similar. For example, motion sequences may be interpolated from a plurality of scans, and motion information may be obtained therefrom for sub-blocks where no scan data is available. The scan data is either scan signals of the magnetic resonance system or scan data from another sensor.

This motion information may be compared with a threshold value even during the scan sequence. The threshold value defines a motion amplitude. An amplitude is, for example, the non-periodic deflection of part of the object under examination and accordingly a measure for the motion. If the motion information exceeds the threshold value, the motion is deemed to be too large and therefore artifact-generating.

The motion information may also be less than or equal to a threshold value, purely in terms of a numerical value. If this value below the threshold value provides an excessively large movement, the movement is then also excessively large. A classification into "motion irrelevant" and "motion excessively large" therefore takes place. If the motion is too large, the sub-block is re-acquired. In the present application, exceeding the threshold value provides that the motion information indicates excessively large motion.

In order to avoid complete repetition of the scan sequence, it is therefore provided to repeat at least the sub-blocks having motion information that exceeds the given threshold and to which excessively large motion is therefore attributed.

In any case, only some of the sub-blocks and therefore also only some of the scan signals will be acquired repeatedly. In other words, the repeat scans do not represent an averaging or a complete re-acquisition.

In a spin echo scan sequence, the sub-blocks where the motion information assigned to the echo signal exceeds the given threshold are therefore repeated. The values of the phase encode gradient that are to be repeated are ultimately determined and stored. The other parameters are usually unchanged.

This makes it possible to repeatedly acquire, quite selectively, the echo signals or k-space lines for which there was excessive motion previously.

In a spin echo scan sequence where only echo signals from a single slice are acquired, only one sub-block exists in a sequence block. Repeating a sub-block is then equivalent to repeating a sequence block.

In the present embodiments, a scan sequence generally denotes a scan sequence where only echo signals from a single slice are acquired. Otherwise, the scan sequence is termed a multislice scan sequence. Exceptions arise if the name or acronym is always assigned a 3D or multislice scan from the scan sequence.

For example, MP-RAGE is a 3D scan sequence, and controlled aliasing in parallel imaging results in higher acceleration (CAIPIRINHA) is a multislice scan.

For example, the automated determination of the artifact-generating echo signals may be used to automatically re-acquire these echo signals, thereby "saving" the image data set. For example, belated inspection of the image data set and the then required re-acquisition of the image data set becomes superfluous.

In the case of a spin echo scan sequence, the method is therefore a method for acquiring a magnetic resonance data set of an object under examination by a magnetic resonance system using an SE scan sequence, where the SE scan sequence includes a succession of sequence blocks. In each sequence block, there is just one sub-block including an excitation section and a detection section. An excitation section includes at least one excitation pulse, and in a detection section, an echo signal is acquired as a scan signal. At least one item of motion information is provided for each sub-block. The motion information contains information about a movement of the object under examination within the duration of the sub-block. Some of the sub-blocks are repeatedly acquired automatically. At least the sub-blocks having motion information that indicates motion that allows a motion artifact in an image data set reconstructed from the magnetic resonance data set (e.g., having motion information that exceeds a threshold value) are repeated, where the threshold value defines a motion amplitude.

In a first embodiment, a sequence block to be repeated is repeated immediately after the passage thereof. In an alternative embodiment, the sequence block is run through again after the passage of all the sequence blocks of the scan sequence.

A TSE scan sequence includes, in a single sequence block (e.g., a single sequence), a 90° excitation pulse with simultaneously applied slice select gradient, immediately followed by a slice rephase gradient, a plurality of 180° refocusing pulses, a plurality of phase encode gradients, a read dephase gradient, and a plurality of acquisition windows with read gradient applied. After the last acquisition window closes, a wait time of a number of hundred milliseconds to a few seconds is inserted in order to obtain the desired repetition time TR.

The 90° excitation pulse with slice select gradient constitutes the excitation section or the excitation phase. This is followed by a detection section in which the acquisition window is opened repeatedly. The read gradient is also repeatedly applied, and different phase encode gradients are applied. A sequence block of a TSE scan sequence then also has a single sub-block in a sequence block.

In general, an echo train may be acquired in each detection section. For example, in a detection section $n_E$, echo signals are acquired as an echo train. An individual sequence block of a TSE scan sequence is repeated $n_{pe}/n_E$ times, where $n_{pe}$ is the number of phase encoding steps. The number $n_{pe}$ of phase encoding steps is again dependent on the resolution to be achieved and whether parallel imaging is used.

In the case of a TSE scan sequence, the method is therefore a method for acquiring a magnetic resonance data set of an object under examination by a magnetic resonance system using a TSE scan sequence. The TSE scan sequence includes a succession of sequence blocks, and in each sequence block, there is just one sub-block including an excitation section and a detection section. An excitation section includes at least one excitation pulse, and in a detection section, an echo train is acquired as a scan signal. At least one item of motion information is provided for each sub-block. The motion information contains information about a movement of the object under examination within the duration of the sub-block. Some of the sub-blocks are repeatedly acquired automatically. At least the sub-blocks having motion information that indicates a movement that allows a motion artifact in an image data set reconstructed from the magnetic resonance data set are repeated.

In a TSE scan sequence, the detection time (e.g., the duration of a detection section) takes up more time compared to the repetition time TR than in an SE scan sequence. The probability of a signal-corrupting movement taking place during data acquisition therefore increases proportionately to the increase in the detection time.

A scan sequence having one sub-block in a sequence block is also a multislice scan sequence in which a multi-band radio frequency (RF) pulse excites a plurality of slices simultaneously. In a sequence block, there is then also only one excitation section and one detection section. This is the case with CAIPIRINHA, for example.

In one embodiment, there may be a plurality of sub-blocks in a sequence block. A plurality of sub-blocks exist, for example, in a multislice scan sequence with one RF pulse that excites a single slice. During the wait time after the first sub-block, one or more other sub-blocks are inserted for which the slice is shifted in the slice select direction with respect to the slices of the other sub-blocks. One sub-block is required for each slice. A plurality of sub-blocks are at least two sub-blocks. At least five slices or sub-blocks may be used.

A plurality of slices may therefore be acquired, and each sub-block of a sequence block is assigned to a slice. For example, the scan signals of the same slice are always acquired at the same position in a sequence block. The first sub-block in a sequence block therefore always belongs to the same slice.

Such a multislice scan sequence may be carried out using all the scan sequences where at least two sub-blocks are achievable in one repetition period. For example, SE and TSE multislice scan sequences are known.

In the case of a TSE multislice scan sequence, the method is then a method for acquiring a magnetic resonance data set of an object under examination by a magnetic resonance system using a TSE multislice scan sequence. The scan sequence includes a succession of sequence blocks, and in each sequence block, there are a plurality of sub-blocks including an excitation section and a detection section. An excitation section includes at least one excitation pulse, and in a detection section, an echo train is acquired as a scan signal. At least one item of motion information is provided for each sub-block, where motion information contains information about a movement of the object under examination within the duration of the sub-block. Some of the sub-blocks are repeatedly acquired automatically. At least the sub-blocks having motion information that indicates a movement that allows a motion artifact in an image data set reconstructed from the magnetic resonance data set are repeated.

Each sequence block contains a plurality of sub-blocks and thus a plurality of excitation sections and a plurality of detection sections, where in each detection section, a plurality of echo signals are acquired in an echo train.

In the case of a TSE multislice scan sequence, the risk of movement during data acquisition is even higher than in a TSE scan sequence, since the detection time takes up even more time compared to the repetition time than in a TSE scan sequence. A TSE multislice scan sequence may therefore be used as the scan sequence.

Alternatively, an SE multislice scan sequence may be used as the scan sequence.

A magnetization prepared rapid gradient echo (MP-RAGE) scan sequence includes, in a single sequence block (e.g., a single sequence), an inversion pulse, a wait time, a plurality of FLASH sub-blocks, and a subsequent wait time. This is a T1-weighted 3D imaging technique.

In an MP-RAGE scan sequence, the method is then a method for acquiring a magnetic resonance data set of an object under examination by a magnetic resonance system using an MP-RAGE scan sequence. The MP-RAGE scan sequence includes a succession of sequence blocks, and in each sequence block, there are a plurality of sub-blocks including an excitation section and a detection section. An excitation section includes at least one excitation pulse, and in a detection section, an echo signal is acquired as a scan signal. At least one item of motion information is provided for each sub-block. The motion information contains information about a movement of the object under examination within the duration of the sub-block. Some of the sub-blocks are repeatedly acquired automatically. At least the sub-blocks having motion information that indicates a movement that allows a motion artifact in an image data set reconstructed from the magnetic resonance data set are repeated.

The sub-blocks to be repeated may be repeated immediately after the scan sequence. This provides that additional sequence repetitions, which are determined depending on the motion information collected, are added directly.

As described above, the advantage is that at least the motion-corrupted scan data is automatically reacquired, and no image assessment is required. Also, repetition is limited to a portion of the sub-blocks, so no complete re-acquisition is necessary.

If a sequence block of a scan sequence has only one sub-block, the sequence blocks are repeated as such. This is termed sequence block repetition. This is always the case with an SE or TSE scan sequence, since only one sub-block exists.

However, if a plurality of sub-blocks exist in a sequence block (e.g., in a multislice scan sequence), different repetition strategies for the sub-blocks may be provided. Then, it is not always necessary to repeat the sequence blocks as such.

In a first embodiment, all the sub-blocks of a sequence block may be repeated if at least one item of motion information of the sub-blocks of the sequence block exceeds the threshold value. Repeating all the sub-blocks of a sequence block provides repeating the sequence block.

Accordingly, even in the case of a sequence block having a plurality of sub-blocks, the entire sequence block may be repeatedly acquired.

In a first alternative, each repeated sub-block may be assigned to an originally acquired sub-block, and the data of the repeated sub-blocks may replace the data of the originally acquired sub-blocks. If, in a sequence block that is uniquely defined at least based on the phase encode gradient to be used, only one or some of the sub-blocks contain motion information that is above the threshold value, the entire sequence block is repeated and replaced. This provides that the echo signals or echo trains are re-acquired with the phase encode gradient to be used and inserted into the scan data set in place of the existing echo signals. Therefore, motion-corrupted echo signals and some of the non-motion-corrupted echo signals are replaced.

Only echo signals are referred to here, because an echo train consists of a plurality of echo signals, and each echo signal of an echo train replaces a corresponding echo signal.

Although this method is easy to implement, some non-motion-corrupted scan signals are discarded.

In an alternative embodiment, each repeated sub-block may therefore be assigned to an originally acquired sub-block, and the data of the repeated sub-blocks is averaged with the data of the originally acquired sub-blocks having motion information that is below the threshold. Thus, only the motion-corrupted sub-blocks (e.g., echo signals or echo trains) are replaced by a sequence block, while the others are used to increase the SNR. This is more efficient in terms of scan data utilization, but requires more post-processing.

As an alternative to repeating all the sub-blocks of a sequence block, it may be provided that only sub-blocks having motion information that is above the threshold value or having motion information that indicates a motion that allows a motion artifact in an image data set reconstructed from the magnetic resonance data set are repeated. Thus, only the sub-blocks that are to be replaced are repeated. This opens up further possibilities.

For example, if no sequence blocks already run through are repeated, new sequence blocks that are not provided in this way are to be created in a simple run-through of a scan sequence. Thus, for the repetition of sub-blocks, the strategy of repeating sequence blocks or reassembling sequence blocks may be followed. The latter is only possible if there are a plurality of sub-blocks or detection sections in a sequence block.

In a first alternative, the sub-blocks to be repeated may be acquired successively in the original order. This arrangement may also be termed chronological. This provides that all the sub-blocks to be repeated are simply divided into new sequence blocks and are acquired one after the other without the position of the sub-blocks within an original sequence block being taken into account.

Arrangement of the sub-blocks to be repeated into new sequence blocks is advantageous in that preparation of the magnetization takes place only in the sequence block, this otherwise being absent. In case of SE and TSE scan sequences, this is the wait time after acquisition of the sub-blocks, and in the case of an MP-RAGE scan sequence, the inversion pulse is added.

For example, if fifteen sub-blocks are corrupted and to be repeated and eight sub-blocks are provided in a sequence block, two sequence blocks are recreated, and these are acquired after the scan sequence has been run through. The last sub-block in the second sequence block may remain free, and any sub-block may also be added.

This allows simple sorting of the data. However, the newly acquired sub-blocks or their echo signals or echo trains may have a different T1-weighting, because the original repetition time TR is not necessarily present in a slice.

In a second alternative, it may therefore be provided that the sub-blocks to be repeated are arranged into newly created sequence blocks, each at the same position as the originally acquired sub-block. It is therefore attempted, in a sequence block, to continue acquiring the slices in the original order, at least as far as possible. In all probability, there will not be the same number of sub-blocks to be repeated in each slice. At some point, there will remain sequence blocks where not all the sub-blocks are "filled". However, the preceding sub-block in each slice will then have the same time interval of a repetition time TR, which provides that the T1-weighting is maintained.

Another possibility for acquiring echo trains more efficiently is to repeatedly acquire only the echo signals of the echo train that cannot be used by a movement. For example, the first four echo signals may be acquired as intended, and a movement only begins at this point. However, this requires motion monitoring that provides motion information for each echo signal. As described in the introduction, not all monitoring methods allow this. While it is possible to provide motion information for a detection section at any time, this is not always the case for every single echo signal.

In summary, before the repeated acquisition of some of the sub-blocks, sequence blocks that are to be executed after the scan sequence has been run through may be defined. This may be mere repetition of already acquired sequence blocks or the acquisition of newly created sequence blocks.

After the repeated acquisition of some of the sub-blocks, either in the newly created sequence blocks or in already acquired sequence blocks, the newly acquired scan signals are to be incorporated into the existing magnetic resonance data set. This may be done by replacing scan signals or by averaging scan signals. This provides a magnetic resonance data set free of motion artifacts.

An essential element of the methods described is the motion information.

In a first alternative, the motion information may be obtained at least partially by way of navigator echoes. In one embodiment of the navigator echo method, position encoding may be achieved in one spatial direction using frequency encoding. Comparison of subsequently acquired images from navigator echoes with an earlier acquired image from a navigator echo allows motion to be estimated in the encoded direction. An image from a navigator echo may be either a 1D image or a 2D image, as illustrated in more detail below.

The navigator echoes are to be acquired before and/or after and/or between the sub-blocks. However, a higher density of motion scans results in a longer scan time, because no other scan signals may be acquired in the periods of time in which navigator echoes are generated and acquired.

It is therefore intrinsically predefined that with navigator echoes, motion information is only available at particular points in time that are before or after the acquisition times of the actual scan signals for the magnetic resonance data set. In this method, it is also not practicable to acquire motion information within an echo train. When using navigator echoes, motion information therefore only exists for a sub-block. If an echo train is acquired within a sub-block, there is no separate information for each echo signal. However, the advantage resides in very good spatial resolution and fast processing of the motion information.

Alternatively or in addition, the motion information may be determined at least partially using a camera. The camera may be sensitive to visible light and/or infrared light and/or ultraviolet light. A camera may also generate images during a scan sequence (e.g., the camera may determine motion information in parallel with acquisition of the magnetic resonance scan data). However, in most cases, a camera cannot be positioned optimally for motion detection because the camera cannot be positioned as required in a magnetic resonance system. In some cases, only relatively large movements may therefore be detected.

In the case of the images of a camera, subtraction images may also be created in order to detect motion. An image as such does not therefore usually provide motion information. It is sufficient to limit the subtraction to relevant image sections.

Also, the image acquisition rate using a camera is predefined. If a camera may capture 20 images per second, this corresponds to 50 milliseconds per image. Even with a camera, it is not possible to provide motion information for every echo signal. This is only possible with a camera for which the acquisition time of an image is less than or equal to the inter-echo time TI. The interecho time TI is the time between two echo signals in the echo train. The interecho time TI does not have to be equal to the echo time TE, but it may be. The camera therefore has to be selected with respect to the maximum available image capture time.

The described or other methods of motion detection may be used in combination in order to obtain as detailed motion information as possible. In addition, movements may be interpolated from the scan data to increase the data density.

With both methods, subsequent correction of the acquired scan signals is possible.

Alternatively, the scan signals (e.g., the echo signals or echo trains) may be corrected prospectively. In the course of a scan sequence, it is continuously checked whether the object under examination has moved in order to match the subsequent data acquisition (e.g., the sub-blocks still to be acquired) to the movement (e.g., by adjusting the gradient settings). The advantage of this is that the scan signals may be further processed immediately after acquisition. Also, the T1-weighting of the scan signal is maintained.

For navigator echoes, continuous monitoring provides that at least one navigator echo is acquired in each sequence block.

If prospective motion correction is used, the number of sub-blocks to be repeated may be kept as low as possible. However, the repetitions are still necessary, since, for example, another movement may occur after the correction but before or even during data acquisition, thus rendering the correction incomplete. The probability of uncorrected motion occurring increases the greater the proportion of repetition time constituted by the detection time.

Of the described scan sequences, the occurrence of uncorrected motion is highest in the case of a TSE multislice scan sequence or an MP-RAGE scan sequence. However, the occurrence of uncorrected motion may also occur in all other scan sequences, but with a lower probability.

The present embodiments also relate to a computer program product that may be loaded into the memory of a programmable control facility or a processing unit of a magnetic resonance system. With this computer program product, all or various of previously described embodiments of the method according to the present embodiments may be carried out when the computer program product is run in the control facility. The computer program product may require program resources (e.g., libraries and auxiliary functions) in order to implement the corresponding embodiments of the method. In other words, the claim relating to the computer program product is intended, for example, to protect software with which one of the above described embodiments of the method may be carried out or which executes that embodiment. The software may be a source code (e.g., C++) that still has to be compiled and fixed or which only needs to be interpreted, or an executable software code that only has to be loaded into the corresponding processing unit or control facility for execution.

The present embodiments additionally relate to a data storage medium for a control facility for controlling a computer (e.g., a data generation unit of a magnetic resonance system and/or an evaluation unit) with data for carrying out the described method. In one embodiment, the data generation unit may be an image generation unit. The evaluation unit may be part of the magnetic resonance system or an external unit. In this case, the data storage medium may also be a permanently accessible memory of the magnetic resonance system. The data storage medium does not have to be installed in the control facility of the magnetic resonance system, but may also be a storage service or cloud server.

The above mentioned methods may be implemented in the control apparatus as software or as hardware (e.g., hard-wired hardware).

In addition, the present embodiments relate to a scan sequence, where the scan sequence includes a succession of sequence blocks, and in each sequence block, there is at least one sub-block including an excitation section and a detection section. An excitation section includes at least one excitation pulse, and in a detection section, there is at least one acquisition window. The scan sequence is characterized in that the beginning and end of a sub-block are identified by a marker. Alternatively or additionally, the beginning and end of a sequence block may be identified by a marker.

The marking makes it possible to transfer the repetition functionality to an external library and to incorporate the repetition functionality into any scan sequence. This provides that the scan sequence does not have to be known when creating the library; the scan sequence may even be created after the library has been created. It is possible to repeat sequence blocks or to create sequence blocks of any scan sequences using a software library.

The present embodiments also relate to a magnetic resonance system having a control facility. The magnetic resonance system is characterized in that the control facility for carrying out the method is configured as described.

Further embodiments of the magnetic resonance system correspond to corresponding embodiments of the method according to the present embodiments. In order to avoid unnecessary repetitions, reference will therefore be made to the corresponding method features and the advantages thereof.

BRIEF DESCRIPTION OF THE DRAWINGS

FIG. 6 shows a schematic partial view of an exemplary scan sequence;

FIG. 7 shows a schematic partial view of exemplary sequence blocks to be repeated;

FIG. 8 shows a schematic partial view of newly created sequence blocks in a first embodiment;

FIG. 9 shows a schematic partial view of newly created sequence blocks in a second embodiment;

FIG. 10 shows a schematic partial view of newly created sequence blocks in a third embodiment; and FIG. 11 shows a flow chart of one embodiment of a method for acquiring a magnetic resonance data set.

DETAILED DESCRIPTION

Figure 1:
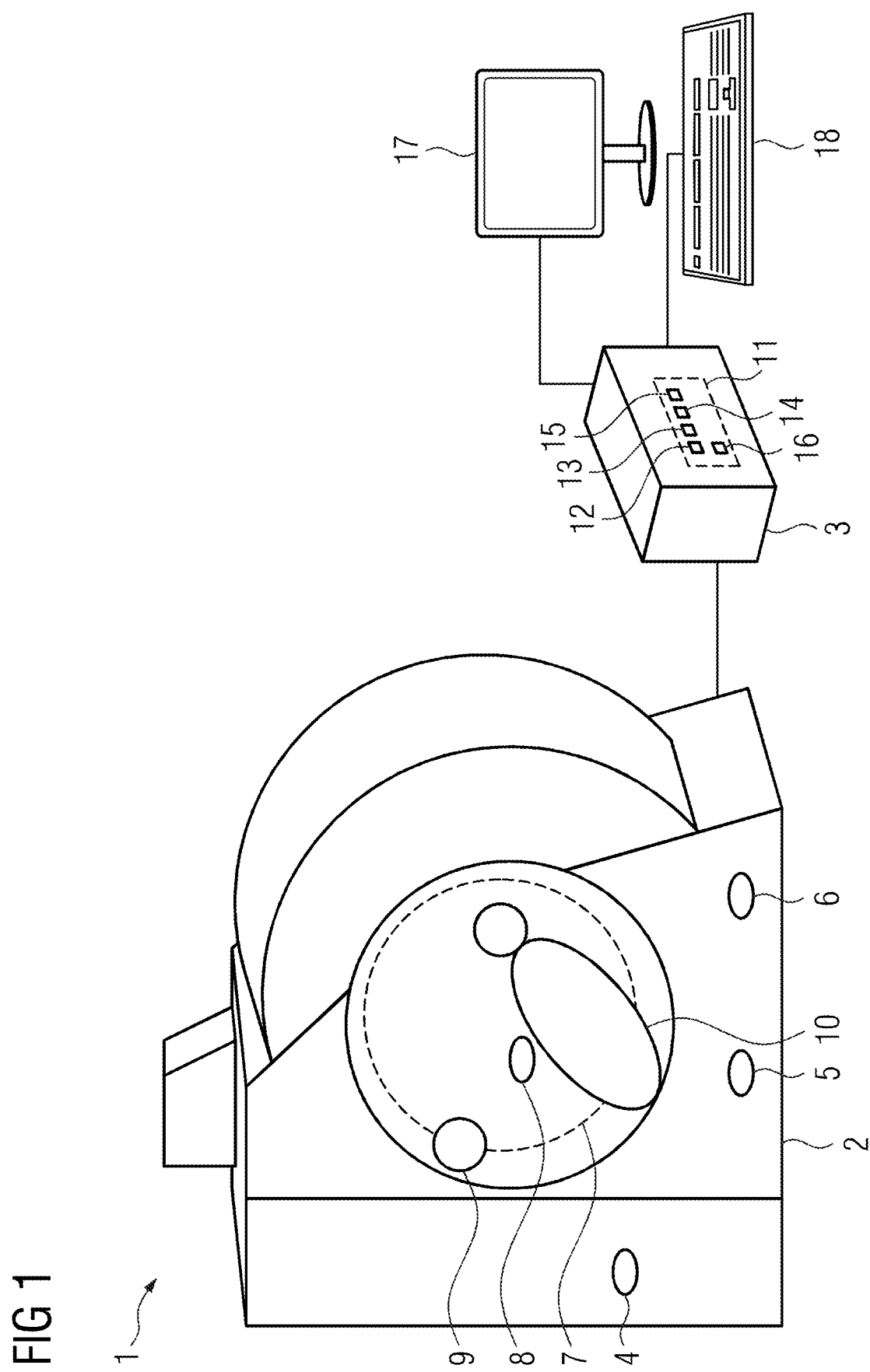
FIG. 1 shows one embodiment of a magnetic resonance system.

FIG. 1 shows one embodiment of a magnetic resonance system 1 including a scanner 2 and a control facility 3. Three gradient coils 4, 5, and 6 are mounted in the scanner 2 to generate gradient fields.

The magnetic resonance system 1 also has a transmit coil arrangement 7 that may be configured as a body coil. The transmit coil arrangement 7 may also be a transmit coil array.

The receive coil array 8 may also be a body coil. To increase a signal-to-noise ratio (SNR), it is also known to use local coils. For example, a coil array may be used to perform parallel imaging. A coil array enables the scan time to be reduced.

A camera 9 is used to capture possible movements of a patient 10 while a scan is being performed.

The control facility 3 of the magnetic resonance system 1 has a data storage medium 11 on which a computer program product 12 for carrying out the described method is stored. This is, therefore, software that is configured to evaluate motion information as described and also controls repeat scans.

The computer program product 12 may be called up by scan sequences such as an SE scan sequence 13, a TSE multislice scan sequence 14, an MP-RAGE scan sequence 15, or other scan sequences or be implemented therein.

SE scan sequences 13 and TSE scan sequences 14 may usually be converted from a single-slice to a multislice scan sequence by selecting the SE scan sequences 13 and the TSE scan sequences 14 in a selection field on an operator facility. Magnetic resonance data sets 16 may also be stored on the data storage medium 11.

The control facility may have a monitor 17 as an output device and a keyboard 18 as an input unit.

Other usual components of the magnetic resonance system 1 such as a patient couch, etc. are not shown for the sake of clarity.

Figure 2:
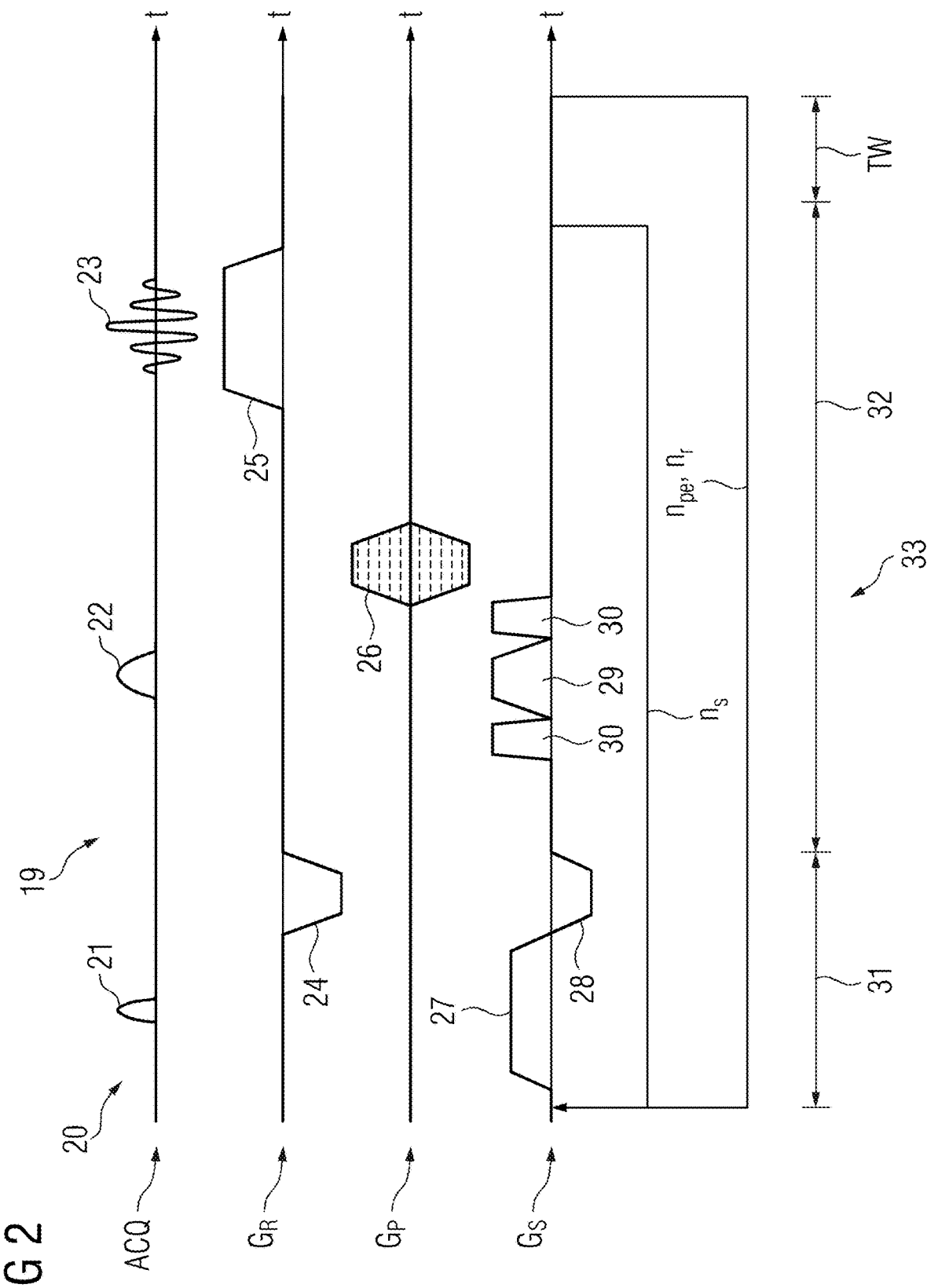
FIG. 2 shows an exemplary SE sequence diagram.

FIG. 2 shows an exemplary sequence diagram 19 of an SE scan sequence 13 for acquiring a magnetic resonance data set 16. The sequence diagram 19 explicitly shows, as usual, one sequence block 20 of the succession of sequence blocks; the others are indicated by the repetition arrows.

The radio frequency pulses and the acquisition windows are shown along the axis ACQ. The RF pulse 21 is used as an excitation pulse. The RF pulse 21 has a flip angle of 90°. Excitation pulses flip the magnetization at least partially into the xy-plane, where the magnetization produces a signal when flipped back. The refocusing pulse 22 has a flip angle of 180°. Such pulses alone do not produce a signal, because the pulses do not flip the magnetization out of the z-direction, the direction of the main magnetic field $B_0$. However, the refocusing pulse 22 refocuses the signal generated by the excitation pulse 21. The excitation pulse 21 and the refocusing pulse 22 produce the echo signal 23. This is also termed spin echo.

A read dephase gradient 24 and a read gradient 25 are applied in the read direction $G_R$. The read dephase gradient 24 dephases the magnetization that is rephased by the read gradient 25. In imaging experiments, the echo signal 23 is therefore a spin and gradient echo. In SE and TSE scan sequences, however, the echo signal 23 is usually referred to as spin echo.

A phase encode gradient 26 is applied in the phase direction $G_P$. The strength of the phase encode gradient 26 varies from sequence block 20 to sequence block 20, which is why the phase encode gradient 26 is shown filled with dashed lines. These indicate the varying strengths.

In the slice direction $G_S$, a slice select gradient 27 is applied simultaneously with the excitation pulse 21. This is followed by a slice rephase gradient 28.

In parallel with the refocusing pulse 22, a slice select gradient 29 is applied. This is flanked by crusher gradients 30. The crusher gradients 30 are configured to compensate for imperfections of the refocusing pulse 22. Alternatively or additionally, the crusher gradients 30 may also be applied in the phase encode direction $G_P$ and/or the read direction $G_R$.

Each sequence block 20 has a plurality of sections. The excitation section 31 includes the excitation pulse 21, the slice select gradient 27, and the slice rephase gradient 28. The detection section 32 includes the rest of the sequence 20 up to the end of the read gradient 25.

The number $n_s$ of slices to be acquired is at the same time the number of sub-blocks 33.

After all the slices have been acquired, a wait time TW is inserted to give the magnetization time to relax. The time from the end of the first sub-block 33 to the end of the repetition time TR ranges from several hundred milliseconds to a few seconds. The wait time TW is thus determined as a function of the number $n_s$ of scanned slices.

$n_{pe}$ is the number of phase encoding steps of the scan sequence 13 without repetitions due to excessive motion.

The number $n_r$ is the number of sequence blocks 20 to be repeated. This depends on how many sub-blocks 33 and therefore, in the case of an SE scan sequence 13, how many echo signals 23 contain motion information exceeding the predefined threshold.

Known variations of the sequence diagram 19 relate to the position of the read dephase gradient 24 and the phase encode gradient 26. With respect to the method described, only the $n_r$ of sequence blocks to be repeated are relevant.

Figure 3:
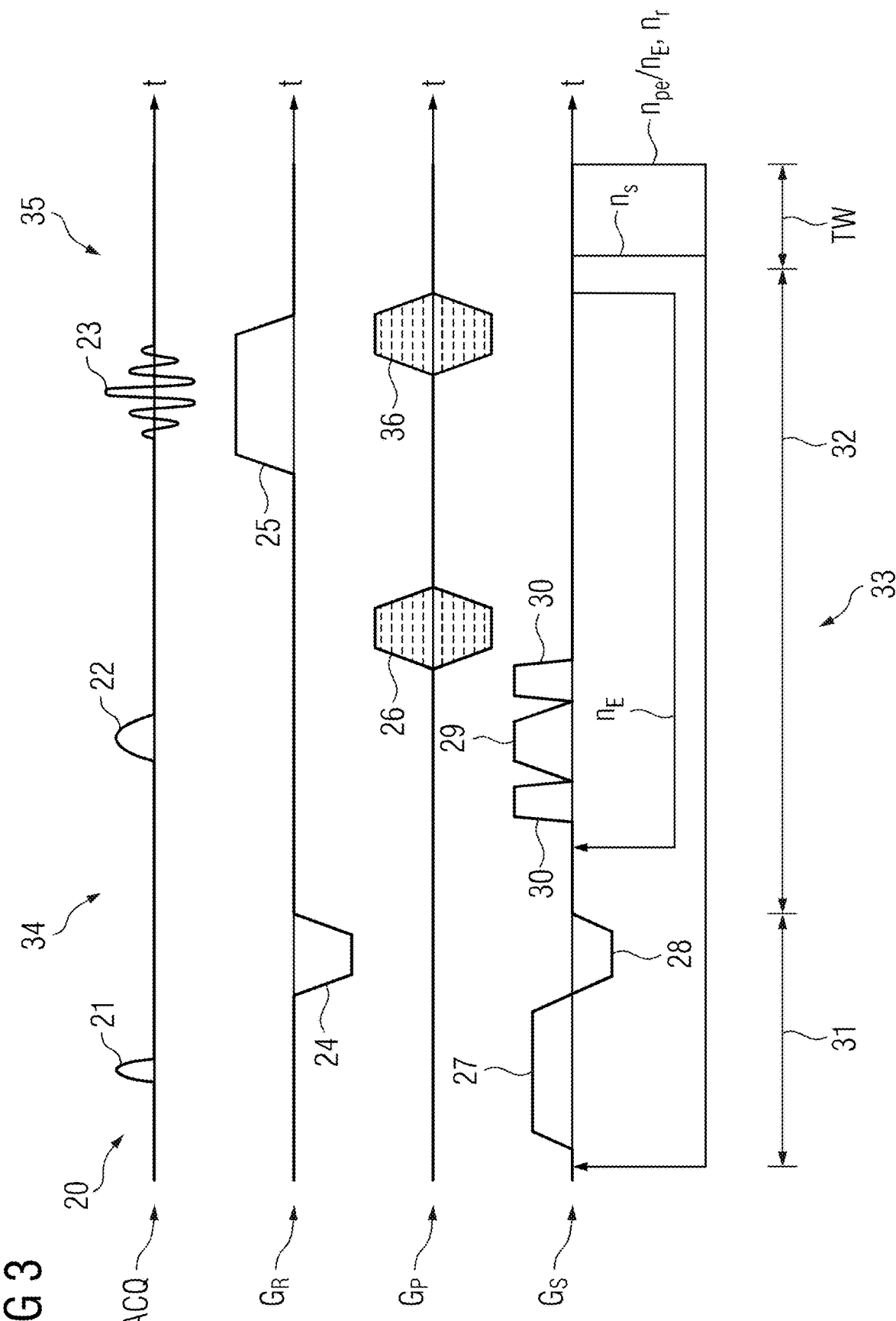
FIG. 3 shows an exemplary TSE sequence diagram.

FIG. 3 shows an exemplary sequence diagram 34 of a TSE multislice scan sequence 14. Most of the elements have already been explained in connection with FIG. 2, which is herewith incorporated by reference.

In contrast to FIG. 2, the detection section 32 includes a plurality of refocusing pulses 22 and a plurality of echo signals 23, where the echo signals 23 constitute an echo train 34. The refocusing pulse 22 is applied $n_E$ times, which provides that the echo train 34 includes $n_E$ echo signals 23.

In the phase direction $G_P$, a phase rewind gradient 36 is applied in addition to the phase encode gradient 24. The phase rewind gradient 36 compensates the gradient torque of the phase encode gradient 24 so that the total phase in the phase direction $G_P$ between two refocusing pulses 21 is zero.

As $n_E$ echo signals are acquired for each echo train, only $n_{pe}/n_E$ sequence blocks 20 are run through, without consideration of the $n_r$ of sequence blocks 20 additionally to be acquired.

Here too, $n_s$ slices may be acquired, where $n_s \geq 1$. In the case of $n_s=1$ (e.g., of one slice), the sequence block has one sub-block 33. For $n_s>1$, there are $n_s$ sub-blocks 33.

Figure 4:
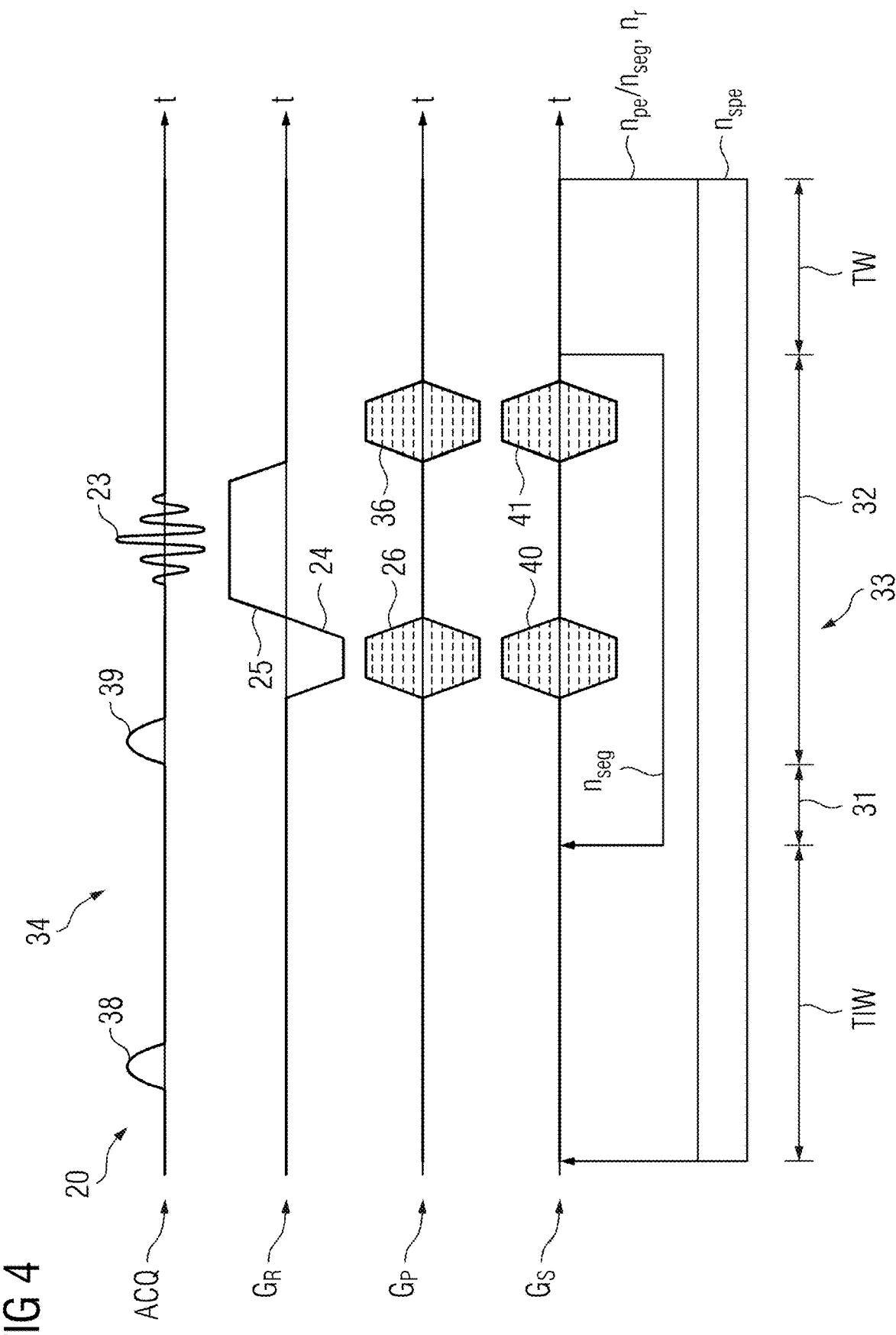
FIG. 4 shows an exemplary MP-RAGE sequence diagram.

FIG. 4 shows an example of a segmented scan sequence (e.g., a sequence diagram 37 of an MP-RAGE scan sequence 15). The sequence diagram 37 shows an inversion pulse 38 that flips the magnetization in the z-direction. After a wait time TIW, the magnetization is sampled with a succession of $n_{seg}$ spoiled gradient echo sub-blocks 33 (e.g., turbo-FLASH). Each gradient echo sub-block 33 is a sub-block 33 of a sequence block 20 of the MP-RAGE scan sequence 15. The excitation pulses 39 have a flip angle of a few degrees. The excitation pulses 39 therefore deflect the magnetization from the z-direction by only a small angle. To restore the magnetization to equilibrium, a wait time TW is introduced at the end of each sequence block 20. The gradients present are as indicated in FIGS. 2 and 3 and have the same function.

In addition, a phase encode gradient 40 and a phase rewind gradient 41 are provided in the slice select direction $G_S$, since an MP-RAGE scan sequence 15 is a T1-weighted 3D scan sequence.

The presence of a plurality of sub-blocks 33 in a sequence block 20 is therefore not dependent on the use of a spin echo based scan sequence or a multislice scan.

$n_{spe}$ is the number of phase encoding steps in the slice select direction. The phase encoding variation sequence may be reversed. It is basically irrelevant whether first the phase encode gradient 26 is stepped through in the phase direction $G_P$ and then the phase encode gradient 40 in the slice select direction $G_S$, or vice versa.

Figure 5:
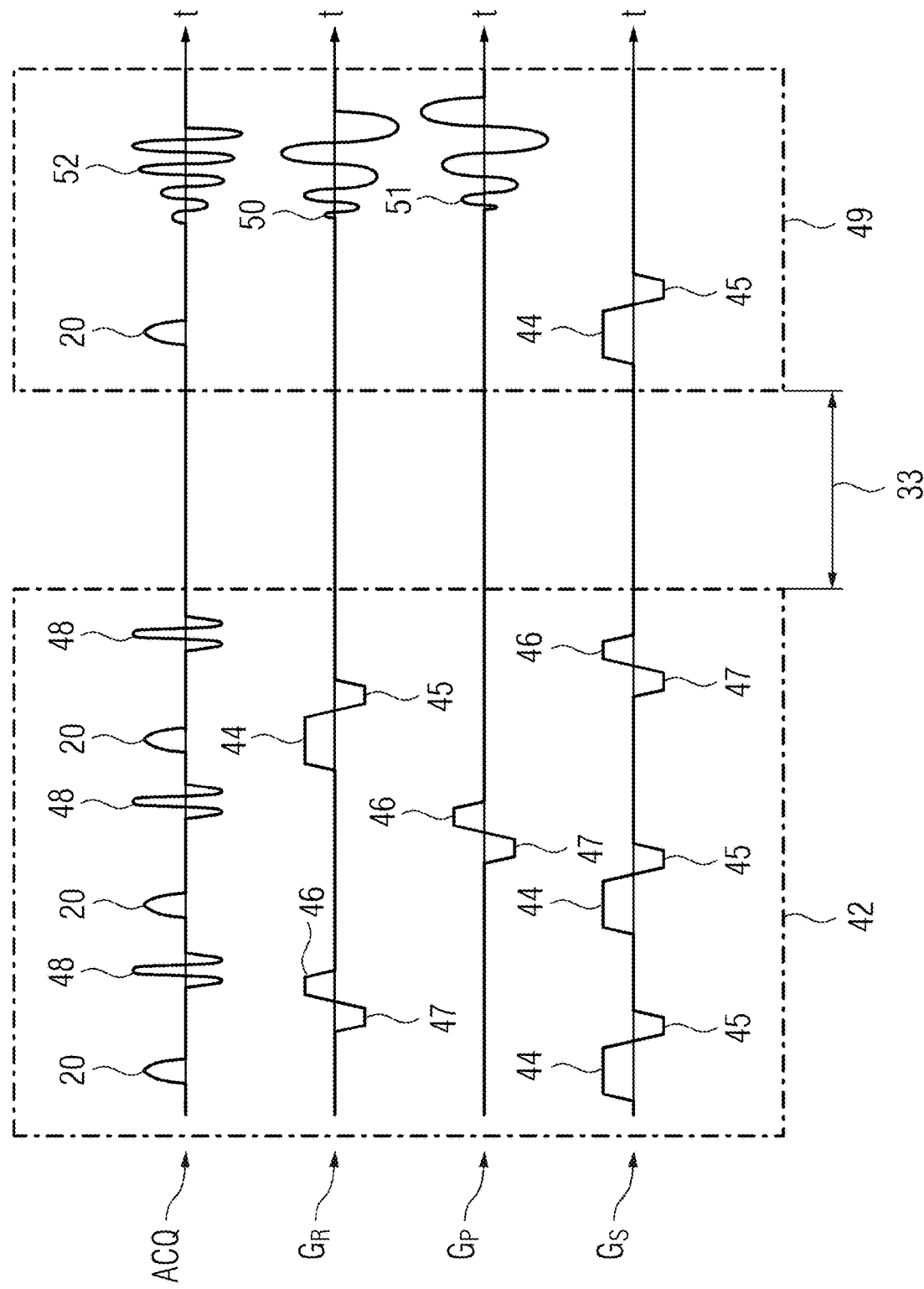
FIG. 5 shows two exemplary navigator echo modules.

FIG. 5 shows two exemplary ways of acquiring navigator echoes. These may be placed before and/or after and/or between the imaging section consisting of the sub-block 33 or sub-blocks 33. The first embodiment of a navigator echo module 42 is positioned before the sub-blocks 33. An excitation pulse 43 having a slice thickness that is determined via a slice select gradient 44 is applied consecutively for each of the directions $G_R$, $G_P$, and $G_S$. The slice rephase gradient 45 and the read dephase gradient 46 may be applied simultaneously. A navigator echo 48 is then generated using the read gradient 47 in each case. The navigator echo 48 is a 1D image and shows movements in the direction in which the read gradient 47 is applied.

The imaging section including one or more sub-blocks 33 is only shown schematically.

A spiral readout is shown in the navigator echo module 49 following the imaging section. By a gradient 50 and a gradient 51, a navigator echo 52 is therefore generated from which a two-dimensional image may be created. This provides that two directions may be monitored simultaneously. The gradients 50 and 51 are to be positioned or distributed in the $G_R$, $G_P$, and $G_S$ directions such that the desired plane or slice may be monitored.

The following alternatives may be provided.

A 1D navigator echo 48 may only be acquired in one of the three directions $G_R$, $G_P$, and $G_S$ (e.g., before and/or after a sub-block 33 or between two sub-blocks 33).

If two directions are monitored, the described embodiments likewise exist.

If navigator echoes 52 are generated, the navigator echoes 52 may likewise be before and/or after a sub-block 33 and/or between two sub-blocks 33.

If the navigator echoes are not acquired between the sub-blocks 33, motion information is only available for one sequence block 20.

Since the number of navigator modules rises as the number of sub-blocks 33 increases, the number of acquirable sub-blocks 33 decreases, as the acquirable signal decays with the relaxation time T2. It is therefore also possible to use the camera 9 to collect motion information for subsequent evaluation in addition to a navigator module before and after the sub-blocks 33 during scanning of the sub-blocks 33.

Using the same navigator echo modules 42 or 49 before and after the imaging section, motion in the wait time TW may be detected in order to correct the motion prospectively. In addition, motion during the sub-blocks 33 may be detected, and re-acquisition of the sub-blocks 33 affected may be performed automatically.

In principle, it is also possible to acquire different navigator echoes 48 and 52 in one sequence block 20. However, this does not allow direct comparison of these navigator echoes, which requires additional calculations to limit the time period of a movement. Therefore, selecting one or other of the navigator echo modules 42 or 49 may be provided. Whether this module is used once, twice, or even more often in a sequence block 20 depends on constraints such as the T2 relaxation time of the magnetization, the lengthening of the scan time by the modules, and other factors.

FIG. 6 shows a schematic partial view of a scan sequence including a plurality of sub-blocks 33 (e.g., a TSE multislice scan sequence or an MP-RAGE scan sequence). In this case, each sub-block 33.1a to 33.3d is constituted by a block. The beginning and end of a sequence block 20.1 to 20.3 is indicated by an arrow 53, and the beginning and end of a sub-block 33 is indicated by an arrow 54. These arrows 53 and 54 may also be used as markers in a scan sequence in the form of a control instruction in order to enable the computer program product 12 to be used in a large number of scan sequences 13, 14, and 15.

For the sake of clarity, each sequence block 20.1 to 20.3 has only four sub-blocks 33. In a TSE multislice scan sequence, there are four slices, and in an MP-RAGE scan sequence, it would be four echo signals with different phase encoding. The differentiation of the sub-blocks 33 into sub-blocks 33.1a to 33.3d is only intended to illustrate the different procedure for executing the repeat sequence blocks 20; the sub-blocks 33 differ only in the position in a sequence block 20.1 to 20.3 and the phase encode gradient used (see above). The first index relates to the sequence block, and the second index relates to the slice or respective sub-block. The sub-block 33.2c is therefore in the second sequence block 20.2 (e.g., the third slice).

Motion information 55 is provided for each of the sub-blocks 33.1a to 33.3d (e.g., motion information 55.1a to 55.3d), which may be greater than, equal to, or less than a threshold value th. All the sub-blocks 33.1a and 33.3c with motion information 55.1b and 55.3c greater than the threshold value th are marked as to be repeated. This is indicated by a dashed border.

FIG. 7 shows a first embodiment for the repetition of sub-blocks 33. Here, all the sub-blocks 33.1a to 33.1d and 33.3a to 33.3d of the sequence blocks 20.1 and 20.3, where at least one item of motion information 55.1b and 55.3c was greater than the threshold value th, are repeated. The already acquired sequence blocks 20.1 and 20.3 are therefore repeated. The sub-blocks 33.1a' to 33.1d' and 33.3a' to 33.3d' are created. These are arranged in the repeatedly acquired sequence blocks 20.1' and 20.3'.

In a first embodiment, the newly acquired sub-blocks 33.1a' to 33.1d' and 33.3a' to 33.3d' may completely replace the previous sub-blocks 33.1a to 33.1d and 33.3a to 33.3d. In an alternative, second embodiment, only the sub-blocks 33.1b and 33.3c where the movement was excessively large are replaced. The newly acquired sub-blocks 33.1a', 33.1c', 33.1d', 33.3a', 33.3b' and 33.3d' are each averaged with the previous sub-block 33.1a, 33.1c, 33.1d, 33.3a, 33.3b or 33.3d, which increases the SNR.

FIG. 8 shows a second embodiment for the repetition of sub-blocks 33. The sub-block 33.4a has been introduced as a motion-corrupted sub-block for illustration purposes. Only the sub-blocks 33.1b, 33.3c and 33.4a in newly assembled sequence blocks 56 having motion information 55.1b, 55.3c and 55.4a that exceeds the threshold value th are repeated. In this embodiment, re-acquisition is performed irrespective of the position of the sub-blocks 33 in the original sequence block 20 but purely chronologically; for this reason, the T1 weighting may come out differently from the original sub-block 33.

FIG. 9 therefore shows a third embodiment for the repetition of sub-blocks 33. Only the sub-blocks 33.1b, 33.3c, and 33.4a having motion information 55.1b, 55.3c and 55.4a that exceeds the threshold value th are repeated. However, when creating the new sequence blocks 55, the position of the sub-blocks 33 in the original sequence block 20 is maintained, thereby preserving the T1 weighting. The disadvantage of this, however, is that the slice having most sub-blocks 33 to be repeated determines the number of additional sequence blocks 55 to be acquired, where, as the repetition progresses, fewer and fewer sub-blocks 33' are acquired in a sequence block 55.

FIG. 10 therefore shows a fourth embodiment for the repetition of sub-blocks 33. Again, only the sub-blocks 33.1a, 33.1b, 33.3c, and 33.4a having motion information 55.1a, 55.1b, 55.3c and 55.4a that exceeds the threshold value th are repeated. By way of illustration, the sub-block 33.1a has been additionally introduced as motion-corrupted. A place at an original position is available for the sub-blocks 33.1a, 33.1b and 33.3c in a newly created sequence block 56. However, there would have to be another new sequence block 56 for the sub-block 33.4a. To avoid this, the sub-block 33.4a is placed at the vacant position in the newly created sequence block 56. Thus, in the present example, 75% of the newly acquired sequence blocks 33' have original T1 weighting, but the scan time of the repeat scans was able to be halved from two sequence blocks 56 to one.

FIG. 11 shows a flow chart of one embodiment of a method for acquiring a magnetic resonance data set 16 of an object under examination using a magnetic resonance system 1.

In act S1, the object under examination 10 is positioned in the magnetic resonance system 1, the alignment measurements are performed, and a scan sequence is selected. Objects under examination that move are not only patients, but also animals, which are being increasingly scanned. Flow phantoms may have movements as well as other inanimate objects under examination that may slip due to vibrations.

An example of a TSE multislice scan sequence 14 will now be discussed. In act S2, a sequence block 20 is run through. In act S2.1, the phase encode gradient of this sequence block 20 is determined. In act S2.2, a first navigator echo 49 is acquired. Thereafter, as act 2.3, the sub-block 33 of a slice is acquired, and then, as act 2.4, a second navigator echo 49 is acquired. Acts 2.3 and 2.4 are repeated $n_s$ times (e.g., for each slice). As a result, one item of motion information 55 is available for each sequence block 33.

Act S2 including sub-acts S2.1 to S2.4 is repeated $n_{pe}$ or $n_{pe}/n_E$ times depending on the scan sequence until the scan data set 16 is acquired.

Any movement that occurs cannot be corrected during actual data acquisition, only before the individual sequence blocks 20.

If the movement of the object under examination 10 within a sub-block 33 is too large, that sub-block 33 is to be repeated. A corresponding metric for the strength of the movement is used. The repetition information is stored in a buffer for this purpose. As the repetition of a sub-block 33 is possible within the structure of a sequence block 20, this may be carried out following the actual acquisition of a scan sequence in three ways:

1.) In the simplest form, the sub-blocks 33 affected, which are to be repeated due to excessive motion, are arranged in one or more repeat sequence blocks 20'. Here the order of the sub-blocks 33' to be repeated may be a simple sorting scheme (e.g., chronological), as shown in FIG. 7. In contrast to the following two versions, taking the example of the TSE multislice scan sequence 14, it would not be guaranteed that exactly the same image contrast would be acquired. However, averaging effects might possibly make this limitation acceptable in some cases.

2.) Each sequence block 20 that contains a sub-block 33 corrupted by excessive motion is repeated unchanged. There are two alternatives for using the resulting scan signals.

A) The scan signals (e.g., echo signals or echo trains) of motion-corrupted sub-blocks 33 are replaced by the newly acquired sub-blocks 33'. The scan signals of non-motion-corrupted sub-blocks 33 are averaged. This also produces an improved SNR.

B) The scan signals of all the sub-blocks 33 of repeated sequences 20 are replaced by the newly acquired sub-blocks 33'.

3.) If there are a very large number of sub-blocks 33 to be repeated, new sequence blocks 56 may be created using the information from the motion-corrupted sub-blocks 33, as shown also in FIG. 10. Instead of repeating all three sequence blocks 20.1, 20.3, and 20.4 again, a new sequence block 56 is created from the required k-space lines that were acquired by the corrupt sub-blocks 33.1*a*, 33.1*b*, 33.3*c* and 33.4*a* using the corresponding sub-blocks 33' (e.g., 33.1*a*', 33.1*b*', 33.3*c*' and 33.4*a*').

The free positions of sub-blocks 33' in the newly created sequence blocks 56 may then be skipped. Echo signals 23' or echo trains 34' may be acquired from any other sub-blocks 33' at the same position in a sequence block 20' for averaging Echo signals 23' or echo trains 34' may be acquired from specific other sub-blocks 33 where the amount of movement was below but close to the rejection limit. Echo signals 23' or echo trains 34' may be acquired from any other sub-blocks 33' at another position in a sequence block 20 for averaging. However, the position in the sequence block 56 is only to be shifted by no more than one position or another previously defined value. In addition, the k-space center is not to be in one of the shifted echo trains 34'.

The re-acquisition time may thus be reduced accordingly.

In act S3, sequence blocks 20' to be repeated or sequence blocks 56 to be re-acquired are defined according to one of the described alternatives. This may be done in parallel with or after act S2.

In act S4, the sequences 20' to be repeated or sequences 55 to be re-acquired are acquired. Repetition of a sequence block 20 is as described if all the sub-blocks 33 of the original sequence block 20 are included, and re-acquisition is as described if a new sequence block 56 is combined with sub-blocks 33' that differ from the original sub-blocks 33.

As act S5, the newly acquired echo signals are inserted into scan dataset 16 or averaged with corresponding echo signals 23 to obtain a motion-corrected scan dataset 16.

The advantage of the method described resides in completely automatic re-acquisition of suboptimally motion-corrected scan signals by an existing motion correction module. For this purpose, a scan sequence may provide markers 54 and/or 55 so that the computer program product 12 may recognize that sections are possibly allowed to be repeated (e.g., whether always only complete sequence blocks 20 are repeated or also sub-blocks 33). Otherwise, this process runs completely identically for all scan sequences.

Advantageous in the case of the third embodiment for repeating sub-blocks 33 is the concept of how sub-blocks 33 may be optimally re-acquired in a time-optimized manner. The advantage here is the significant time saving for re-acquisition.

New scan sequences may therefore be very quickly adapted to this method.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for acquiring a magnetic resonance data set of an object under examination by a magnetic resonance system using a scan sequence, wherein the scan sequence comprises a sequence of sequence blocks, and each sequence block of the sequence of sequence blocks contains at least one sub-block comprising an excitation section, a detection section, or the excitation section and the detection section, wherein the excitation section comprises at least one excitation pulse, the method comprising:

acquiring, in a respective detection section, an echo signal or an echo train as a scan signal, wherein at least one item of motion information is provided for each sub-block, wherein the motion information contains information about movement of the object under examination within a duration of the respective sub-block, wherein some of the sub-blocks are repeatedly acquired automatically based on the motion information contained in the respective sub-blocks, and wherein at least the sub-blocks having motion information that indicates motion that results in a motion artifact in an image data set reconstructed from the magnetic resonance data set are repeated.

2. In a non-transitory computer-readable storage medium that stores instructions executable by one or more processors to acquire a magnetic resonance data set of an object under examination by a magnetic resonance system using a scan sequence, wherein the scan sequence comprises a sequence of sequence blocks, and each sequence block of the sequence of sequence blocks contains at least one sub-block comprising an excitation section, a detection section, or the excitation section and the detection section, wherein the excitation section comprises at least one excitation pulse, the instructions comprising:

acquiring, in a respective detection section, an echo signal or an echo train as a scan signal, wherein at least one item of motion information is provided for each sub-block, wherein the motion information contains information about movement of the object under examination within a duration of the respective sub-block, wherein some of the sub-blocks are repeatedly acquired automatically based on the motion information contained in the respective sub-blocks, and wherein at least the sub-blocks having motion information that indicates motion that allows a motion artifact in an image data set reconstructed from the magnetic resonance data set are repeated.

3. A magnetic resonance system comprising:

a controller configured to acquire a magnetic resonance data set of an object under examination by a magnetic resonance system using a scan sequence, wherein the scan sequence comprises a sequence of sequence blocks, and each sequence block of the sequence of sequence blocks contains at least one sub-block comprising an excitation section, a detection section, or the excitation section and the detection section, wherein the excitation section comprises at least one excitation pulse, the acquisition of the magnetic resonance data set comprising:

acquisition, in a respective detection section, of an echo signal or an echo train as a scan signal, wherein at least one item of motion information is provided for each sub-block, wherein the motion information contains information about movement of the object under examination within a duration of the respective sub-block, wherein some of the sub-blocks are repeatedly acquired automatically based on the motion information contained in the respective sub-blocks, and wherein at least the sub-blocks having motion information that indicates motion that allows a motion artifact in an image data set reconstructed from the magnetic resonance data set are repeated.

4. The method of claim 1, wherein a plurality of sub-blocks are present in a sequence block of the sequence of sequence blocks.

5. The method of claim 1, wherein all sub-blocks of a sequence block of the sequence of sequence blocks are repeated when at least one item of motion information of the sub-blocks of the sequence block indicates motion that results in a motion artifact in an image data set reconstructed from the magnetic resonance data set.

6. The method of claim 1, wherein each repeated sub-block is assigned to an originally acquired sub-block, and the data of the repeated sub-blocks replaces the data of the originally acquired sub-blocks in each case.

7. The method of claim 1, wherein each repeated sub-block is assigned to an originally acquired sub-block, and the data of the repeated sub-blocks is averaged with the data of the originally acquired sub-blocks having motion information that does not indicate motion that results in a motion artifact in an image data set reconstructed from the magnetic resonance data set.

8. The method of claim 1, wherein only sub-blocks having motion information that indicates motion that results in a motion artifact in an image data set reconstructed from the magnetic resonance data set are repeated.

9. The method of claim 8, wherein the sub-blocks are repeatedly acquired consecutively in an original order.

10. The method of claim 8, wherein the sub-blocks to be repeated are arranged in newly created sequence blocks, in each case at a same position as an originally acquired sub-block.

11. The method of claim 1, wherein the motion information is at least partially obtained by a camera.

12. The method of claim 1, wherein the motion information is obtained at least partially by navigator echoes.

13. The method of claim 1, wherein a plurality of slices are acquired, and each sub-block of a sequence block of the sequence of sequence blocks is assigned to a slice of the plurality of slices.

14. The method of claim 1, wherein the sub-blocks to be repeated are arranged in newly created sequence blocks.

* * * * *